(12) United States Patent
Bennett

(10) Patent No.: US 6,288,613 B1
(45) Date of Patent: Sep. 11, 2001

(54) BIAS CIRCUITS FOR DEPLETION MODE FIELD EFFECT TRANSISTORS

(75) Inventor: Jeffrey H. Bennett, Kanata (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/594,583

(22) Filed: Jun. 15, 2000

(51) Int. Cl.[7] ........................................................ H03F 3/16
(52) U.S. Cl. ............................ 330/296; 330/277; 330/288
(58) Field of Search .................................... 330/277, 288, 330/290

(56) References Cited

U.S. PATENT DOCUMENTS 5,506,544 * 4/1996 Staudinger et al. ................. 330/296
5,724,004 * 3/1998 Reif et al. ............................. 330/296
5,808,515 * 9/1998 Tsuruoka et la. ..................... 330/277
5,892,400 * 4/1999 Van Saders et al. ................. 330/277
5,994,968 * 11/1999 Kawai et al. ......................... 330/296

* cited by examiner

Primary Examiner—Michael B Shingleton

(57) ABSTRACT

A bias circuit for providing a gate voltage for a first depletion mode FET operating on RF signals comprises a second similar FET in a source-follower configuration with zero gate-source voltage to conduct a drain-source current Idss via a source resistor. A third depletion mode FET has its gate connected to receive a voltage dropped across this source resistor, its source coupled to a diode whose forward voltage drop constitutes a reference voltage, and its drain connected to a second resistor, a voltage drop across which due to the drain-source current of the third FET constitutes a gate-source voltage for the first FET. The bias circuit compensates for process variations in manufacture of the first FET, and also provides temperature compensation.

20 Claims, 2 Drawing Sheets

US 6,288,613 B1

BIAS CIRCUITS FOR DEPLETION MODE FIELD EFFECT TRANSISTORS

This invention relates to bias circuits for depletion mode field effect transistors (FETs).

BACKGROUND is well known to use depletion mode FET circuits for operation at high frequencies, for example in radio frequency amplifiers and mixers. Such FET circuits typically comprise metal-semiconductor FETs (MESFETs) using semiconductors such as gallium arsenide (GaAs) or indium phosphide; however, the same comments and this invention can also be applied to other types of depletion mode FETs, including for example metal-oxide-semiconductor FETs (MOSFETs) and junction FETs. For various reasons, process variations which inevitably occur in the manufacture of such FETs and integrated circuits including such FETs result in varying characteristics of the manufactured devices.

For depletion mode FETs it has been recognized that enhanced and consistent RF operation can be established by controlling DC characteristics of the FETs, and in particular by controlling a bias voltage supplied to each FET. By providing an appropriate gate bias, a desired drain-source current of the FET can be determined and maintained, resulting in a predictable RF performance. Consequently, a useful yield of manufactured devices with relatively stable characteristics can be provided by a bias circuit which supplies to each FET a bias voltage to compensate for process variations in the manufacturing process. Accordingly, such a bias circuit is desirably provided as part of an integrated circuit including the FET to be biassed, so that the FET and the bias circuit are subject to the same process variations.

In addition, it is desirable for the bias circuit to provide compensation for other factors, such as aging and temperature variation, which can otherwise adversely affect the operating characteristics of the FET. Alternatively, it may be desired to provide a PET which has a predetermined non-zero dependence of one of its parameters, e.g. drain-source current, with a parameter such as temperature, for example to compensate for a similar but opposite dependence of other circuits with which the FET is used.

Thus there is a need to provide a bias circuit for a depletion mode FET which can facilitate achieving such desires.

SUMMARY OF THE INVENTION

According to one aspect of this invention there is provided a bias circuit for providing a gate voltage for a first depletion mode FET (field effect transistor) to be controlled, the bias circuit comprising: a second depletion mode FET having similar characteristics to the first FET, the second FET having its gate coupled to its source for conducting a drain-source current via a resistor to produce a first voltage dependent on the drain-source current; and a comparator for comparing the first voltage with a reference voltage to produce said gate voltage in dependence upon differences between the first voltage and the reference voltage, so that an increase in said drain-source current of the second FET results in a change of said gate voltage of the first FET to reduce drain-source current of the first FET thereby to compensate for process variations of said first and second FETs.

Another aspect of the invention provides a bias circuit for providing a gate voltage for a first depletion mode FET (field effect transistor) to be controlled, the bias circuit comprising: a second depletion mode FET having similar characteristics to the first FET, the second FET having a source-follower configuration with its gate coupled to its source for conducting a drain-source current via a first resistor to produce a first voltage dependent on the drain-source current across the first resistor; a third depletion mode FET having its gate coupled to the first resistor to receive the first voltage, its source arranged to receive a reference voltage, and its drain connected to a second resistor for conducting drain-source current of the third FET via said second resistor to produce said gate voltage for the first FET at the drain of the third FET.

The invention also provides a method of compensating for process variations to which a first depletion mode FET is subject by controlling a gate voltage of the first FET, comprising the steps of: biassing a second depletion mode FET, subject to substantially the same process variations as the first FET, with an approximately zero gate-source voltage so that it conducts a drain-source current via a first resistor to produce a first voltage; supplying the first voltage and a reference voltage to the gate and source respectively of a third depletion mode FET whereby the third FET conducts a drain-source current via a second resistor coupled to the drain of the third FET; and deriving the gate voltage of the first FET from a junction between the drain of the third FET and the second resistor.

BRIEF DESCRIPTION OF THE DRAWINGS

The invention will be further understood from the following description by way of example with reference to the accompanying drawings, in which.

DETAILED DESCRIPTION

Figure 1:
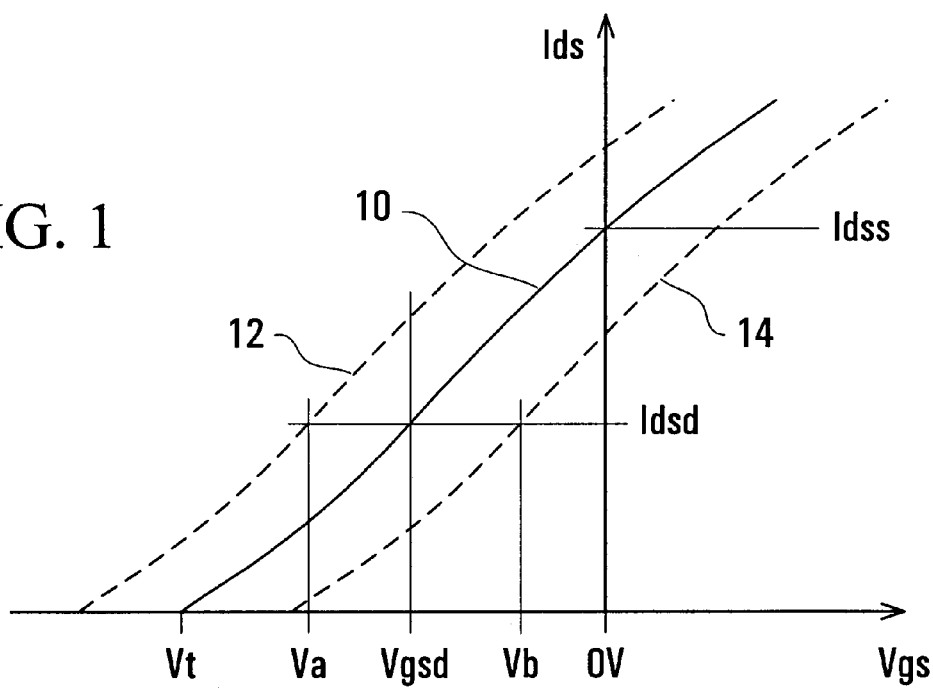
FIG. 1 is a graph illustrating a drain-source current versus gate-source voltage characteristic of a depletion mode FET.

Referring to FIG. 1, which is a graph illustrating drain-source current Ids of an n-channel depletion mode GaAs FET as a function of its gate-source voltage Vgs, a solid line 10 represents a typical characteristic, showing that with a gate-source voltage of zero (0V) the FET passes a drain-source current Idss. With a negative gate-source voltage of increasing magnitude applied to the FET, the drain-source current Ids decreases approximately linearly, reaching zero when the gate-source voltage Vgs reaches a pinch-off or threshold voltage Vt.

A depletion mode FET used for RF signals may be desired to operate normally with a desired DC drain-source current which is a predetermined fraction of the current Idss. For example, FIG. 1 illustrates a desired operating drain-source current Idsd which is 50% of the current Idss. To provide such a desired operating drain-source current, as shown in FIG. 1 a desired negative gate-source voltage Vgsd must be applied to the gate of the FET.

Due to factors such as operating temperature, aging, and especially process variations a manufactured FET may have a characteristic which is shifted relative to the typical characteristic shown by the line 10 in FIG. 1, to the left as shown by a dashed line 12 or to the right as shown by a dashed line 14. Within this range of variation, applying a fixed value of the desired gate-source voltage Vgsd to the gates of different FETs results in a substantial variation of drain-source current of the FETs, which is undesired because it can adversely affect operating parameters such as the frequency response of the FET. In order to maintain the desired drain-source current Idsd despite the varying characteristics, it is necessary to vary the applied gate-source voltage within a range from a voltage Va for the characteristic line 12 to a voltage Vb for the characteristic line 14.

Figure 2:
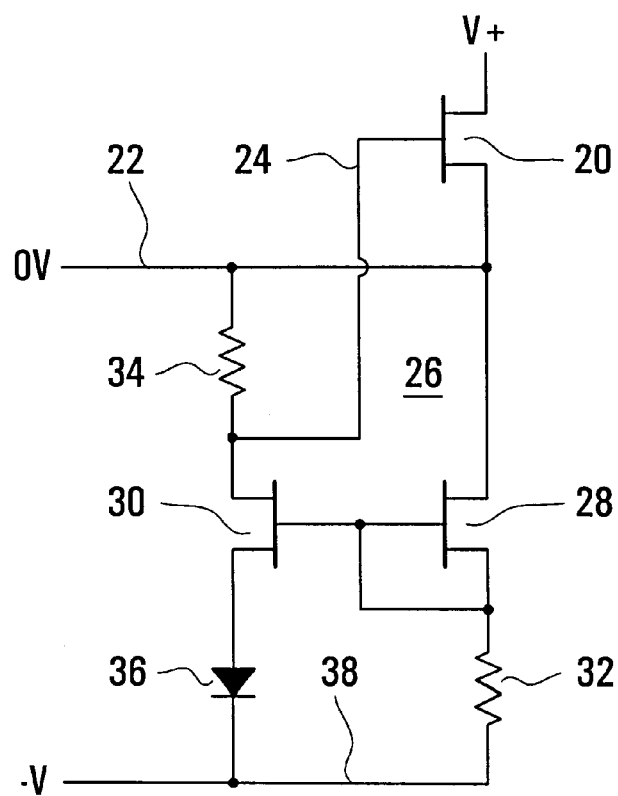
FIG. 2 schematically illustrates a bias circuit for a depletion mode FET in accordance with an embodiment of the invention.

Accordingly, it is desirable to provide a bias circuit which is integrated with the FET, and therefore is subject to substantially the same process and temperature variations, for applying such a variable bias voltage to the gate of the FET. FIG. 2 illustrates such a bias circuit in accordance with an embodiment of the invention, and the FET whose gate-source voltage is controlled by the bias circuit.

Referring to FIG. 2, an n-channel depletion mode GaAs FET 20 has its source coupled to a zero voltage line 22, its drain coupled to a positive voltage V+, and its gate coupled to a line 24 to receive a bias voltage produced by the bias circuit 26. FIG. 2 does not illustrate other components which are associated with the PET 20 for coupling RF signals to and from the FET 20, these being provided in known manner according to desired RF functions of the FET 20. Thus FIG. 2 only represents, in a simple manner, the connections necessary for the FET 20 to provide the desired DC conditions as described above with reference to FIG. 1.

The bias circuit 26 comprises further FETs 28 and 30 which are n-channel depletion mode GaAs FETs similar (e.g. scaled in proportion) to the FET 20 and which are manufactured in the same process and are integrated with the FET 20, so that they are subject to substantially the same process variations. However, the components of the bias circuit 26 operate only under DC conditions, and do not handle any RF signals, because the bias circuit serves only to establish the desired DC operating conditions of the FET 20. The bias circuit 26 also includes resistors 32 and 34 and a voltage reference which is conveniently provided as shown in FIG. 2 by a forward biassed diode 36 whose forward voltage drop constitutes the voltage reference. The diode 36 is conveniently a Schottky (metal-semiconductor junction) diode constituted by a diode-connected FET as described later below, but it may alternatively comprise any other type of diode.

The FET 28 has a source-follower (common drain) configuration with its drain connected to the 0V line 22, its source connected via the resistor 32 to a line 38 to which a negative voltage −V, for example −5 volts, is applied, and its gate connected to its source so that its gate-source voltage is zero. The FET 30 has its gate connected to the gate and source of the FET 28, its source coupled via the diode 36 to the negative voltage line 38, and its drain connected to the line 24 and coupled via the resistor 34 to the 0V line 22.

Because the gate-source voltage of the FET 28 is zero, this FET 28 conducts the drain-source current Idss which produces a proportionate voltage drop across the resistor 32. The magnitude of the resistor 32 is selected so that, with variation of the FET characteristics between the dashed lines 12 and 14 in FIG. 1 and consequent changes in the drain-source current Idss at zero gate-source voltage, this voltage drop across the resistor 32 changes more than the corresponding change between the voltages Va and Vb shown in FIG. 1.

The voltage dropped across the resistor 32, reduced by the reference voltage determined by the diode 36, is applied as a gate-source voltage to the FET 30, which accordingly conducts a drain-source current Ids as determined by the characteristic of the FETs as illustrated in FIG. 1. This drain-source current produces a proportionate voltage drop across the resistor 34, thereby producing a negative voltage on the line 24 which is applied as the desired bias voltage to the gate of the FET 20. The resistance of the resistor 34 is selected, and the bias circuit 26 is arranged, so that, with variation of the characteristic of the FET 20 from the dashed line 12 to the dashed line 14 as shown in FIG. 1, the voltage produced on the line 24 varies from Va to Vb as shown in FIG. 1, to maintain a substantially constant desired drain-source current Idsd of the FET 20.

For example, it can be seen that if due to process variations the characteristic of the FET 20 is moved from the typical characteristic 10 in FIG. 1 towards the characteristic 12, with corresponding changes in the characteristics of the FETs 28 and 30 because they are subject to the same process variations, then the drain-source current Idss for zero gate-source voltage of the FET 28 is increased, and therefore a greater voltage is dropped across the resistor 32. A more positive voltage is consequently applied to the gate of the FET 30 and causes the drain-source current Ids of this FET 30 to increase, so that a greater voltage is dropped across the resistor 34, and the voltage at the drain of the FET 30 and applied to the gate of the FET 20 is more negative. Thus the gate-source voltage of the FET 20 is moved from the voltage Vgsd in FIG. 1 towards the voltage Va, thereby compensating for the process variations and ideally maintaining the drain-source current of the FET 20 substantially constant.

Considered generally, it can be seen that in the bias circuit of FIG. 2 a FET (28) is biassed to conduct at least approximately the drain-source current Idss, this current flowing via a series resistor (32) to generate a voltage which is dependent upon variations of Idss. Another FET (30) serves as a comparator to compare this voltage (at its gate) with a fixed voltage (at its source) generated by a diode (36) to produce a current with an enhanced sensitivity to variations of Idss. This current flows through a load resistor (34) to generate an output voltage of the bias circuit.

The forward voltage of the diode 36 decreases with increasing temperature by about 2.3 mV/° C., whereas the drain-source currents of the FETs decrease by about 1%/° C. with increasing temperature. In the bias circuit of FIG. 2 the use of a diode 36 (or a diode-connected FET) to provide the reference voltage serves advantageously to reduce the effects of temperature variations on the operation of the FET 20. It can be appreciated, however, that instead of the diode 36 any other suitable voltage reference may be provided, whether or not this provides any temperature compensation and whether it is integrated with or provided externally of the bias circuit.

Figure 3:
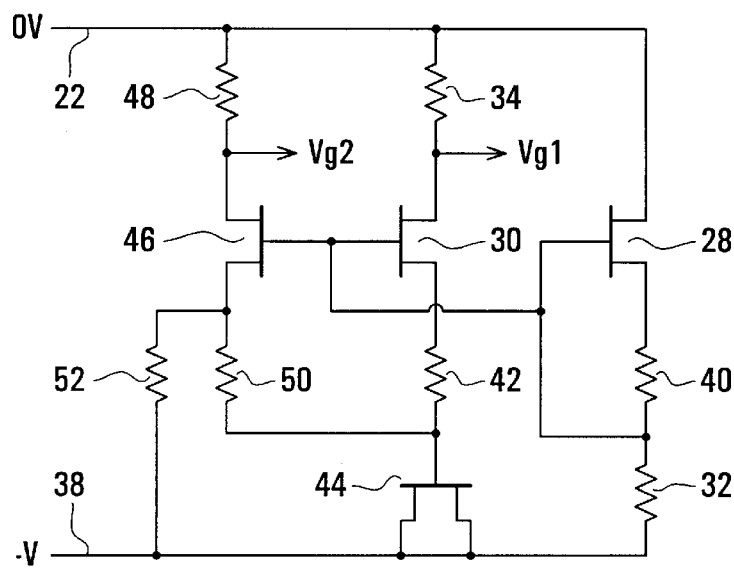
FIG. 3 schematically illustrates another bias circuit for depletion mode FETs in accordance with another embodiment of the invention.

The bias circuit 26 of FIG. 2 can be expanded to provide respective gate voltages for biassing a plurality of FETs, such as the FET 20, which can have different design drain-source currents and different temperature dependencies. Furthermore, the bias circuit 26 can be modified to include source degeneration resistors and/or further resistors to facilitate providing desired circuit gains and resulting desired characteristics of the controlled FETs to which the gate voltages are supplied. By way of example, FIG. 3 illustrates another embodiment of the invention for producing respective gate voltages Vg1 and Vg2 for two FETs (not shown) operating in an RF circuit (not shown) for controlling their drain-source currents at respective levels as discussed above. Further by way of example, it is assumed here that the voltage Vg1 is supplied to the gate of a FET whose desired drain-source current Idsd is 50% of the current Idss, and that the voltage Vg2 is supplied to the gate of a similar FET whose desired drain-source current Idsd is 25% of the current Idss.

In FIG. 3, the same references as in FIG. 2 are used to denote corresponding parts. Thus the bias circuit of FIG. 3 includes 0V and −V lines 22 and 38, FETs 28 and 30, and resistors 32 and 34 which are arranged in a similar manner to that described above, except that the circuit of FIG. 3 also includes degeneration resistors 40 and 42 connected in series with the sources of the FETs 28 and 30 respectively. The voltage reference diode 36 in the bias circuit of FIG. 2 is constituted in the bias circuit of FIG. 3 by a further similar FET 44 which is diode-connected by having its source and drain both connected to the negative voltage line 38, the gate of this diode-connected FET 44 being coupled to the source of the FET 30 via the source degeneration resistor 42. The FET 30 produces at its drain the gate bias voltage Vg1 for a first RF signal FET (not shown) in the same manner as described above in relation to the bias circuit 26 of FIG. 2.

The bias circuit of FIG. 3 further includes another n-channel depletion mode GaAs FET 46 similar to the FETs 28, 30, and 44 and similar to the RF signal FETs (not shown) being controlled, having its drain connected via a resistor 48 to the 0V line 22 and providing the gate bias voltage Vg2 for the second controlled RF signal FET, its gate connected to the gates of the FETs 28 and 30, and its source connected via a source degeneration resistor 50 to the gate of the diode-connected FET 44 and via a further resistor 52 to the negative voltage line 38.

The resistor 52 facilitates providing further independent adjustment of the drain-source current of the FET 46, and its temperature dependence, relative to that of the FET 30, and hence of the gate bias voltage Vg2 separately from the gate bias voltage Vg1. Apart from this, it can be seen that the components 46 to 50 for producing the gate bias voltage Vg2 are arranged similarly to the components 30, 34, and 42 for producing the gate bias voltage Vg1, so that they operate in substantially the same manner as described above. Furthermore, it can be seen that the bias circuit can be similarly extended to provide further gate bias voltages for respective further RF signal FETs to be controlled. It can be appreciated that in the bias circuit of FIG. 3, as illustrated or as extended in such manner, the FETs 28 and 44 and the resistors 32 and 40 are provided in common for the plurality of further FET circuits providing the respective gate bias voltages such as Vg1 and Vg2, but this need not necessarily be the case and separate circuits could be provided instead if desired.

It can be appreciated that the resistances of the resistors in the bias circuit of FIG. 3 can be selected and/or trimmed to provide a desired set of characteristics and drain-source currents for the plurality of controlled RF signal FETs. The source degeneration resistors 40, 42, and 50 typically have relatively small resistances one or more of which may be zero (the respective resistance being replaced by a direct connection as in the bias circuit 26 of FIG. 2), and the resistor 52 typically has a relatively high resistance or can be omitted (open circuit). The following resistances for one implementation of this embodiment of the invention are given purely by way of non-limiting example:

| Resistor: | 32 | 34 | 40 | 42 | 48 | 50 | 52 |
|---|---|---|---|---|---|---|---|
| Resistance (Ω): | 150 | 117 | 10 | 0 | 400 | 450 | 1430 |

Figure 4:
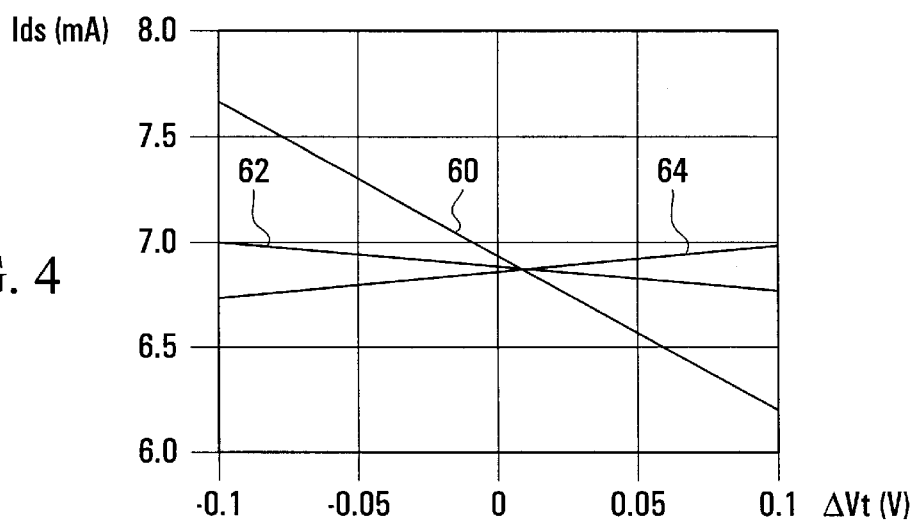
FIG. 4 is a graph illustrating improvements in stability of drain-source current with varying threshold voltage provided by the bias circuit of FIG. 3.
Figure 5:
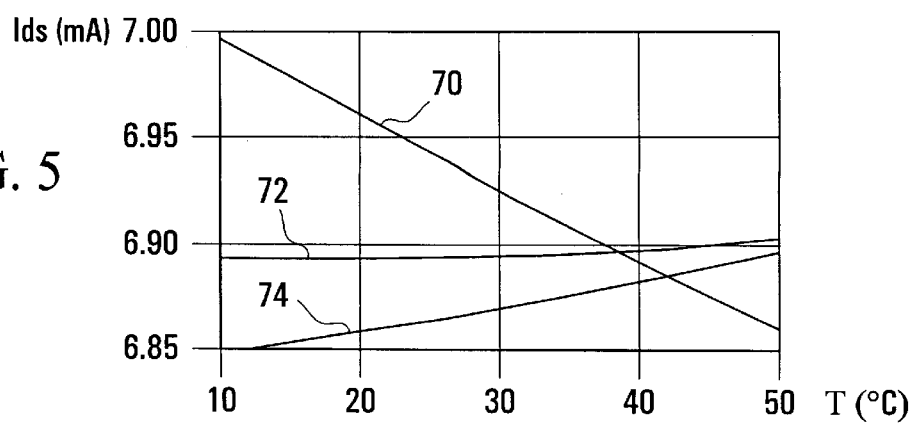
FIG. 5 is a graph illustrating improvements in stability of drain-source current with varying temperature provided by the bias circuit of FIG. 3.

FIGS. 4 and 5 illustrate resulting improvements in the dependencies of the desired drain-source current Idsd of the controlled RF signal FETs with changes ΔVt in the pinch-off or threshold voltage Vt and changes in temperature T respectively. Each of FIGS. 4 and 5 illustrates drain-source currents for three cases, corresponding to 100%, 50%, and 25% of the drain-source current Idss with zero gate-source voltage, but these currents are scaled for the three cases so that they are directly comparable with one another.

Referring to FIG. 4, a line 60 represents variation of drain-source current Ids with changes ΔVt of the threshold voltage Vt for a conventional arrangement, without the bias circuit of the invention as described above, with zero gate-source voltage so that the line 60 represents the case of the drain-source current being 100% of Idss. As shown in FIG. 4, with a negative change ΔVt (towards the dashed line 12 in FIG. 1) the drain-source current is increased, and with a positive change ΔVt (towards the dashed line 14 in FIG. 1) the drain-source current is decreased, the variation in drain-source current being substantial even for the small changes ΔVt illustrated in FIG. 4.

Lines 62 and 64 in FIG. 4 represent the cases of the drain-source current being respectively 50% and 25% of Idss, using the bias circuit of FIG. 3 as described above. In each case the change in drain-source current with changing threshold voltage is greatly decreased in comparison to that represented by the line 60, the sense or direction of this change being arranged to be the same as that represented by the line 60 for the 50% case and being opposite (Ids increasing with decreasing threshold voltage Vt) for the 25% case. It can be appreciated that the parameters (e.g. resistances) of the bias circuit can be selected to make the drain-source current Ids for one controlled FET substantially independent of the threshold voltage, but this can not necessarily also be done at the same time for the other controlled FET because of its different desired drain-source current in conjunction with components of the bias circuit which are common to both controlled FETs as described above. Alternatively, as shown in FIG. 4 a compromise can be made so that the bias circuit provides equal and opposite, relatively small, changes of drain-source current Ids for the two controlled FETs with changes in the threshold voltage Vt.

Similarly, in FIG. 5, a line 70 represents variation of drain-source current Ids with changes of temperature T for the conventional arrangement, without the bias circuit of the invention as described above, with zero gate-source voltage so that the line 70 represents the case of the drain-source current being 100% of Idss. As shown in FIG. 5 by the line 70, this drain-source current Idss decreases with increasing temperature.

Lines 72 and 74 in FIG. 5 represent the cases of the drain-source current being respectively 50% and 25% of Idss, using the bias circuit of FIG. 3 as described above. In the former case the drain-source current is approximately constant with changing temperature, and in the latter case the drain-source current increases with increasing temperature and the magnitude of the change is less than that illustrated by the line 70. The different temperature dependencies arise as a result of the different temperature dependencies of the drain-source current Idss conducted by the FET 28 and the forward voltage drop of the diode-connected FET 44, combined with the different resistor arrangements and their resistances provided for the FETs 30 and 46 which determine the respective gate voltages, and hence drain-source currents, of the controlled FETs. Thus it can be appreciated that the resist or arrangements and their resistances can be selected and/or trimmed to provide a desired temperature dependence (which may be, but need not be, zero) of the drain-source current of one or more of the controlled FETs.

As indicated above, the bias circuit can be used with any type of depletion mode FET, including MOSFETs and junction FETs as well as MESFETs. The diode 36 can be any type of diode to provide the temperature dependence of the reference voltage described above; the use of a Schottky diode constituted by a diode-connected FET as described above is convenient for manufacture where the FETs are MESFETs, and a junction diode could for example conveniently be used where the FETs are junction FETs. As also indicated above, any other desired form of voltage reference, with or without temperature dependence and whether or not it is integrated with the bias circuit (for example, it could be constituted by an externally-provided voltage) could instead be used.

In addition, as described above the FETs 30 and 46 serve as comparators, and other forms of comparator may be used instead. However, the use of the depletion mode FETs 30 and 46 is preferred because this is simple, convenient, and practical when the bias circuit is integrated with the FET 20 being controlled. This is also preferred because the offset voltage and temperature characteristics of these comparator FETs are then similar to those of the FETs 20 and 28 being controlled, so that the resistances of the resistors can be adjusted to take these characteristics into account.

Thus although particular embodiments of the invention have been described above in detail, it can be appreciated that numerous modifications, variations, and adaptations may be made without departing from the scope of the invention as defined in the claims.

What is claimed is:

1. A bias circuit for providing a gate voltage for a first depletion mode FET (field effect transistor) to be controlled, the bias circuit comprising:
   a second depletion mode FET having similar characteristics to the first FET, the second FET having its gate coupled to its source for conducting a drain-source current via a resistor to produce a first voltage dependent on the drain-source current; and
   a comparator for comparing the first voltage with a reference voltage to produce said gate voltage in dependence upon differences between the first voltage and the reference voltage, so that an increase in said drain-source current of the second FET results in a change of said gate voltage of the first FET to reduce drain-source current of the first FET thereby to compensate for process variations of said first and second FETs.

2. A bias circuit as claimed in claim 1 and including a forward biassed diode, wherein the reference voltage comprises a forward voltage drop of the diode.

3. A bias circuit as claimed in claim 2 wherein the diode is constituted by a diode-connected FET.

4. A bias circuit as claimed in claim 1 wherein the second FET has a source-follower configuration with said resistor connected to its source.

5. A bias circuit as claimed in claim 4 wherein the second FET has its gate coupled to its source via a source degeneration resistor.

6. A bias circuit as claimed in claim 1 wherein the comparator comprises a third depletion mode FET having similar characteristics to the first and second FETs, its gate coupled to the resistor to receive the first voltage, its source arranged to receive the reference voltage, and its drain connected to a further resistor for conducting drain-source current of the third FET via the further resistor to produce said gate voltage for the first FET at the drain of the third FET.

7. A bias circuit as claimed in claim 6 and including a diode connected to the source of the third FET and forward biassed by the drain-source current of the third FET, the reference voltage comprising a forward voltage drop of the diode.

8. A bias circuit as claimed in claim 7 wherein the diode is constituted by a diode-connected FET.

9. A bias circuit as claimed in claim 6 wherein the second FET has a source-follower configuration with said resistor connected to its source.

10. A bias circuit as claimed in claim 6 and including a second comparator for comparing the first voltage with the reference voltage to produce a second gate voltage, for another depletion mode FET to be controlled and having similar characteristics to the first FET, in dependence upon differences between the first voltage and the reference voltage, wherein the second comparator comprises a fourth depletion mode FET having similar characteristics to the first and second FETs, its gate coupled to the resistor to receive the first voltage, its source arranged to receive the reference voltage, and its drain connected to another resistor for conducting drain-source current of the fourth FET via said another resistor to produce said second gate voltage at the drain of the fourth FET.

11. A bias circuit as claimed in claim 10 wherein at least one of the third and fourth FETs has its source connected to a source degeneration resistor via which it receives said reference voltage.

12. A bias circuit as claimed in claim 1 and including a second comparator for comparing the first voltage with the reference voltage to produce a second gate voltage, for another depletion mode FET to be controlled and having similar characteristics to the first FET, in dependence upon differences between the first voltage and the reference voltage.

13. A bias circuit for providing a gate voltage for a first depletion mode FET (field effect transistor) to be controlled, the bias circuit comprising:
   a second depletion mode FET having similar characteristics to the first FET, the second FET having a source-follower configuration with its gate coupled to its source for conducting a drain-source current via a first resistor to produce a first voltage dependent on the drain-source current across the first resistor;
   a third depletion mode FET having its gate coupled to the first resistor to receive the first voltage, its source arranged to receive a reference voltage, and its drain connected to a second resistor for conducting drain-source current of the third FET via said second resistor to produce said gate voltage for the first FET at the drain of the third FET.

14. A bias circuit as claimed in claim 13 wherein the second FET has its gate coupled to its source via a source degeneration resistor.

15. A bias circuit as claimed in claim 13 and including a diode connected to the source of the third FET and forward biassed by the drain-source current of the third FET, the reference voltage comprising a forward voltage drop of the diode.

16. A bias circuit as claimed in claim 15 wherein the diode is constituted by a diode-connected FET.

17. A bias circuit as claimed in claim 15 and including a fourth depletion mode FET having its gate coupled to the first resistor to receive the first voltage, its source coupled to the diode to receive the reference voltage, and its drain connected to a third resistor for conducting drain-source current of the fourth FET via said third resistor to produce another gate voltage, for another FET to be controlled and having similar characteristics to the first and second FETs, at the drain of the fourth FET.

18. A bias circuit as claimed in claim 17 wherein at least one of the third and fourth FETs has its source connected to the diode via a source degeneration resistor.

19. A method of compensating for process variations to which a first depletion mode FET is subject by controlling a gate voltage of the first FET, comprising the steps of:

biassing a second depletion mode FET, subject to substantially the same process variations as the first FET, with an approximately zero gate-source voltage so that it conducts a drain-source current via a first resistor to produce a first voltage;

supplying the first voltage and a reference voltage to the gate and source respectively of a third depletion mode FET whereby the third FET conducts a drain-source current via a second resistor coupled to the drain of the third FET; and deriving the gate voltage of the first FET from a junction between the drain of the third FET and the second resistor.

20. A method as claimed in claim 19 and further comprising the step of producing the reference voltage from a forward voltage drop of a diode which is coupled to the source of the third FET and conducts drain-source current of the third FET.

* * * * *